(12) United States Patent
Kear et al.

(10) Patent No.: US 7,671,519 B2
(45) Date of Patent: Mar. 2, 2010

(54) BOND PAD FOR USE WITH PIEZOELECTRIC CERAMIC SUBSTRATES

(75) Inventors: Steven Scott Kear, Albuquerque, NM (US); Carl Jojola, Albuquerque, NM (US); Terence Patrick Miller, Albuquerque, NM (US)

(73) Assignee: CTS Corporation, Elkhart, IN (US)

( * ) Notice: Subject to any disclaimer, the term of this patent is extended or adjusted under 35 U.S.C. 154(b) by 67 days.

(21) Appl. No.: 12/220,595

(22) Filed: Jul. 25, 2008

(65) Prior Publication Data

US 2009/0058230 A1    Mar. 5, 2009

Related U.S. Application Data

(60) Provisional application No. 60/967,033, filed on Aug. 31, 2007.

(51) Int. Cl.
*H01L 41/047* (2006.01)
(52) U.S. Cl. .................................... 310/365
(58) Field of Classification Search ............... 310/312, 310/363–366
See application file for complete search history.

(56) References Cited

U.S. PATENT DOCUMENTS

| | | | |
|---|---|---|---|
| 2,546,321 A * | 3/1951 | Ruggles | 310/312 |
| 2,657,320 A * | 10/1953 | Ziegler | 310/352 |
| 4,468,582 A | 8/1984 | Fujiwara et al. | |
| 4,658,650 A * | 4/1987 | Yorinaga et al. | 73/654 |
| 4,990,943 A | 2/1991 | Phillips | |
| 5,345,361 A | 9/1994 | Billotte et al. | |
| 5,405,476 A | 4/1995 | Knecht | |
| 5,675,208 A | 10/1997 | Huang et al. | |
| 5,747,914 A | 5/1998 | Huang et al. | |
| 5,861,703 A | 1/1999 | Losinski | |
| 5,872,419 A | 2/1999 | Hall et al. | |
| 6,333,589 B1 | 12/2001 | Inoi et al. | |
| 6,495,945 B2 * | 12/2002 | Yamaguchi et al. | 310/324 |

(Continued)

FOREIGN PATENT DOCUMENTS

DE        35 04 011       8/1986

(Continued)

OTHER PUBLICATIONS

Steiner, Markus, PCT International Search Report mailed Oct. 30, 2008 re: International Application No. PCT/US2008/009135 filed Jul. 29, 2008.

(Continued)

*Primary Examiner*—Thomas M Dougherty
(74) *Attorney, Agent, or Firm*—Mark P. Bourgeois; Daniel J. Deneufbourg

(57) ABSTRACT

A piezoelectric assembly includes a piezoelectric substrate that has a top surface, a bottom surface, and at least one side surface. A top electrode is defined on the top surface and a first aperture is defined in the top electrode. A bottom electrode is disposed on the bottom surface. The electrodes are formed from a thin film metal. A first thick film bond pad is disposed in the first aperture and is in contact with the piezoelectric substrate. The first thick film bond pad is in electrical contact with the top electrode. In further embodiments, a second thick film bond pad is disposed on either the top surface or in a second aperture defined in the bottom electrode.

18 Claims, 6 Drawing Sheets

U.S. PATENT DOCUMENTS

2005/0248237 A1* 11/2005 Wierach .................... 310/365
2005/0253270 A1 11/2005 Sasaki

FOREIGN PATENT DOCUMENTS

| DE | 102 15 572 | 12/2002 |
|---|---|---|
| EP | 1 748 500 | 1/2007 |
| EP | 1 764 843 | 3/2007 |
| JP | 2005-249666 | 9/2005 |

OTHER PUBLICATIONS

Steiner, Markus, PCT Written Opinion of the International Searching Authority mailed Oct. 30, 2008 re: International Application No. PCT/US2008/009135 filed Jul. 29, 2008.

* cited by examiner

BOND PAD FOR USE WITH PIEZOELECTRIC CERAMIC SUBSTRATES

CROSS-REFERENCE TO RELATED APPLICATION

This application claims the benefit of the filing date of U.S. Provisional Patent Application Ser. No. 60/967,033 filed on Aug. 31, 2007, which is explicitly incorporated herein by reference as are all references cited therein.

FIELD OF THE INVENTION

The present invention generally relates to piezoelectric substrates and, more particularly, to bond pads and electrodes for piezoelectric substrates.

DESCRIPTION OF THE RELATED ART

Piezoelectric devices find applications in a variety of systems and applications. Piezoelectric devices are used in ultrasonic transducers, hydrophones, actuators, motion control devices, vibration generation, and inkjet printers.

Piezoelectric devices require an interface for either supplying a source of electrical power to the piezoelectric device or for removing electrical power that is generated by the piezoelectric device.

One possible interface can be provided by applying a contact material, in the form of one or more electrodes, to a piezoelectric substrate. Prior art piezoelectric devices have used electrodes that are deposited by sputter or electroless chemical deposition and are made of materials that are solderable in order to attach leads or wires. Some of the prior art electrodes have been formed from materials such as nickel, gold or tin.

Unfortunately, gold is expensive to use as an electrode material and electroless nickel has a low adhesive strength to ceramic substrates.

What is needed is a bond pad for use with piezoelectric substrates that has good adhesion to ceramic substrates, is low in cost, has good solderability and allows the piezoelectric substrate to mechanically vibrate without any noticeable damping effect from the bond pad.

SUMMARY OF THE INVENTION

It is a feature of the invention to provide a piezoelectric assembly that includes a piezoelectric substrate that has a top surface, a bottom surface, and at least one side surface. A top electrode is disposed on the top surface and a first aperture is located in the top electrode. A bottom electrode is disposed on the bottom surface.

In one embodiment, a first thick film bond pad is disposed in the first aperture and is in electrical contact with the top electrode. In another embodiment, a second bond pad is located in a second aperture located in the bottom electrode. The second bond pad is in electrical contact with the bottom electrode.

In a further embodiment, a second thick film bond pad is disposed on the top surface and extends onto a first side surface. The second thick film bond pad is in electrical contact with the bottom electrode.

BRIEF DESCRIPTION OF THE DRAWINGS

These and other features of the invention can best be understood by the following description of the accompanying drawings as follows.

DETAILED DESCRIPTION

Figure 1:
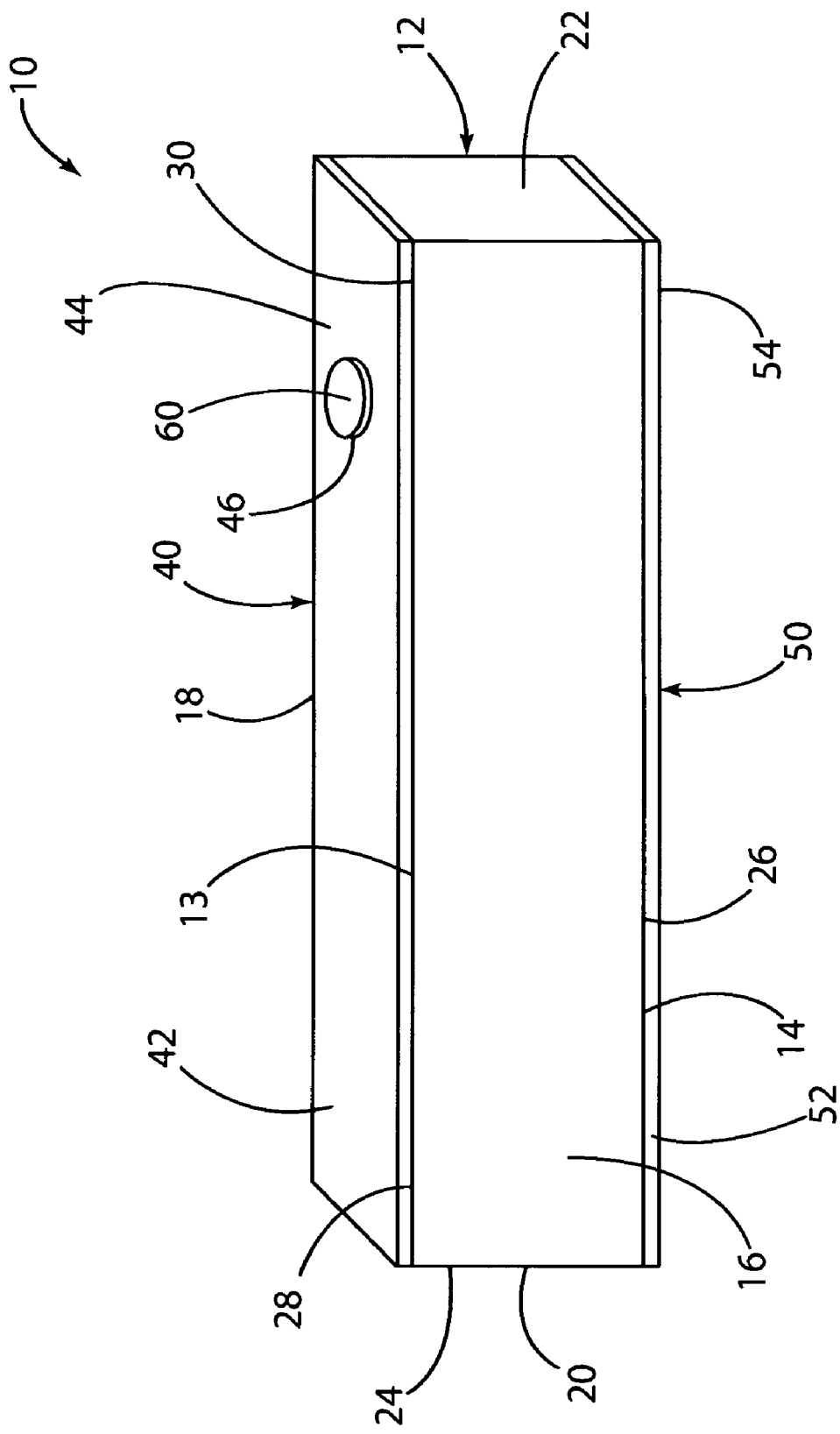
FIG. 1 is a perspective view of a piezoelectric assembly in accordance with the present invention.
Figure 2:
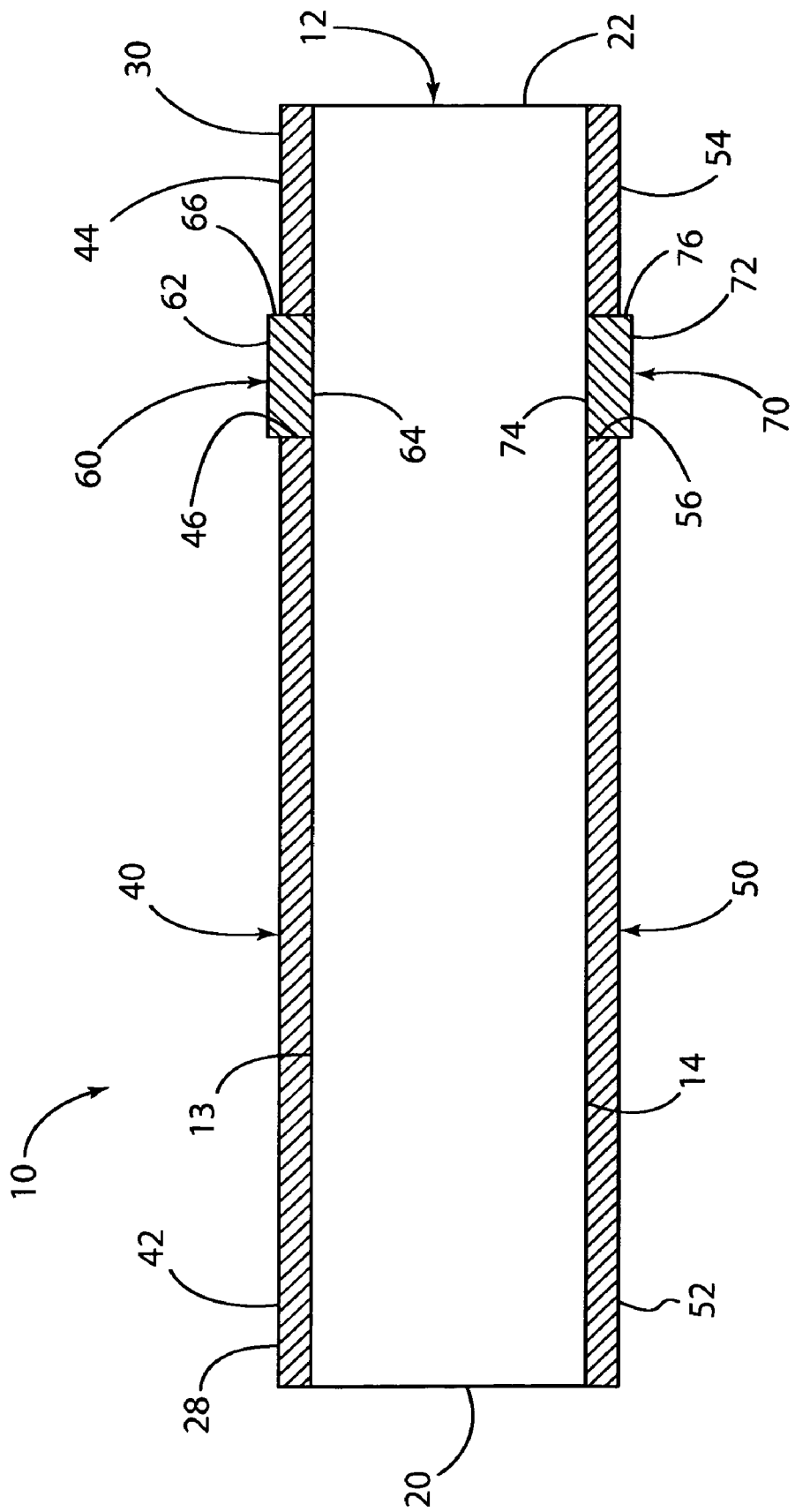
FIG. 2 is a vertical cross-sectional view of the piezoelectric assembly shown in FIG. 1.

A piezoelectric assembly 10 in accordance with the present invention is shown in FIGS. 1 and 2.

Piezoelectric assembly 10 includes a generally rectangular shaped piezoelectric substrate 12 that has a top surface 13, a bottom surface 14 and four side surfaces or faces 16, 18, 20 and 22. Substrate 12 defines edges 24 (FIG. 1) at the intersection between the side surfaces and edges 26 (FIG. 1) at the intersection between the top and side surfaces. Substrate 12 further defines opposed longitudinal end portions 28 and 30. Although not shown, it is understood that the substrate 12 may also have other shapes such as round or square.

Piezoelectric substrate 12 may be made out of a wide variety of piezoelectric ceramic materials such as lead zirconate titantate ($Pb(ZrTi)O_3$), commonly known by the abbreviation PZT, or other materials such as, for example, quartz or lithium niobate. Piezoelectric substrate 12 exhibits the piezoelectric effect wherein the overall shape of the substrate changes when an electrical potential is applied.

Piezoelectric assembly 10 may have overall dimensions of about 0.400 inches in length by about 0.100 inches in width by about 0.025 inches in height.

A thin film top electrode 40 is located on and overlays the full area of (i.e., the full length and width of) top surface 13 and a thin film bottom electrode 50 is located on and overlays the full area (i.e., the full length and width of) bottom surface 14. Thin film electrodes 40 and 50 can be formed from a metal composition that is not solderable such as nickel and vanadium or can be formed from a composition of nickel and chromium. The compositions can be deposited using a conventional sputtering process. Top electrode 40 defines opposed longitudinal end portions 42 and 44 and a circular aperture 46 located adjacent end portion 44 (FIGS. 1 and 2). Bottom electrode 50 defines opposed longitudinal end portions 52 and 54 and a circular aperture 56 adjacent end portion 54 (FIG. 2). In the embodiment shown, apertures 46 and 56 are disposed in a diametrically opposed relationship.

A circular thick film top bond pad 60 (FIGS. 1 and 2) is located in aperture 46 and seated on a portion of the top surface 13 of substrate 12. A circular thick film bottom bond pad 70 (FIG. 2) is located in aperture 56 and covers a portion of bottom surface 14 of substrate 12. Thick film bond pads 60 and 70 can be formed from a solderable metal such as silver or gold or a composition such as silver and palladium. The thick film compositions can be deposited using conventional thick film screening and firing processes.

Top bond pad 60 defines a top surface 62, a bottom surface 64 in abutting relationship with the top surface 13 of substrate 12, and an outer peripheral surface 66. Bottom bond pad 70 defines a top surface 72, a bottom surface 74 in abutting relationship with the bottom surface 14 of substrate 12, and an outer peripheral side surface 76. Bond pads 60 and 70 are thicker than electrodes 40 and 50 and thus extend above the top surface of adjacent electrodes 40 and 50 as shown in FIGS. 1 and 2. Electrodes 40 and 50 have a typical thickness of about 750 Angstroms. Bond pads 60 and 70 have a typical thickness of about 350 μinches. Bond pads 60 and 70 have a typical diameter or width of about 0.070 inches.

Electrodes 40 and 50 are connected to bond pads 60 and 70 along outer peripheral side board surfaces 66 and 76 thereof to form a mechanical and electrical bond during the manufacturing processing.

Bond pads 60 and 70 allow for the piezoelectric assembly 10 to be connected to another external electrical circuit such as a printed circuit board. Bond pads 60 and 70 can be attached to a printed circuit board through the use of a reflowed solder paste or a conductive adhesive.

Because bond pads 60 and 70 are formed using a thick film material and process, bond pads 60 and 70 have a high bond strength to substrate 12. The use of a small diameter thick film bond pad with a large thin film electrode allows the piezoelectric assembly to mechanically vibrate without any noticeable damping effect from the bond pad. If the entire electrode were to be fabricated from a thick film material, the large mass of the thick film material would act to dampen vibrational energy within the piezoelectric ceramic, thereby altering the desired performance characteristics.

Manufacturing Process

Figure 3:
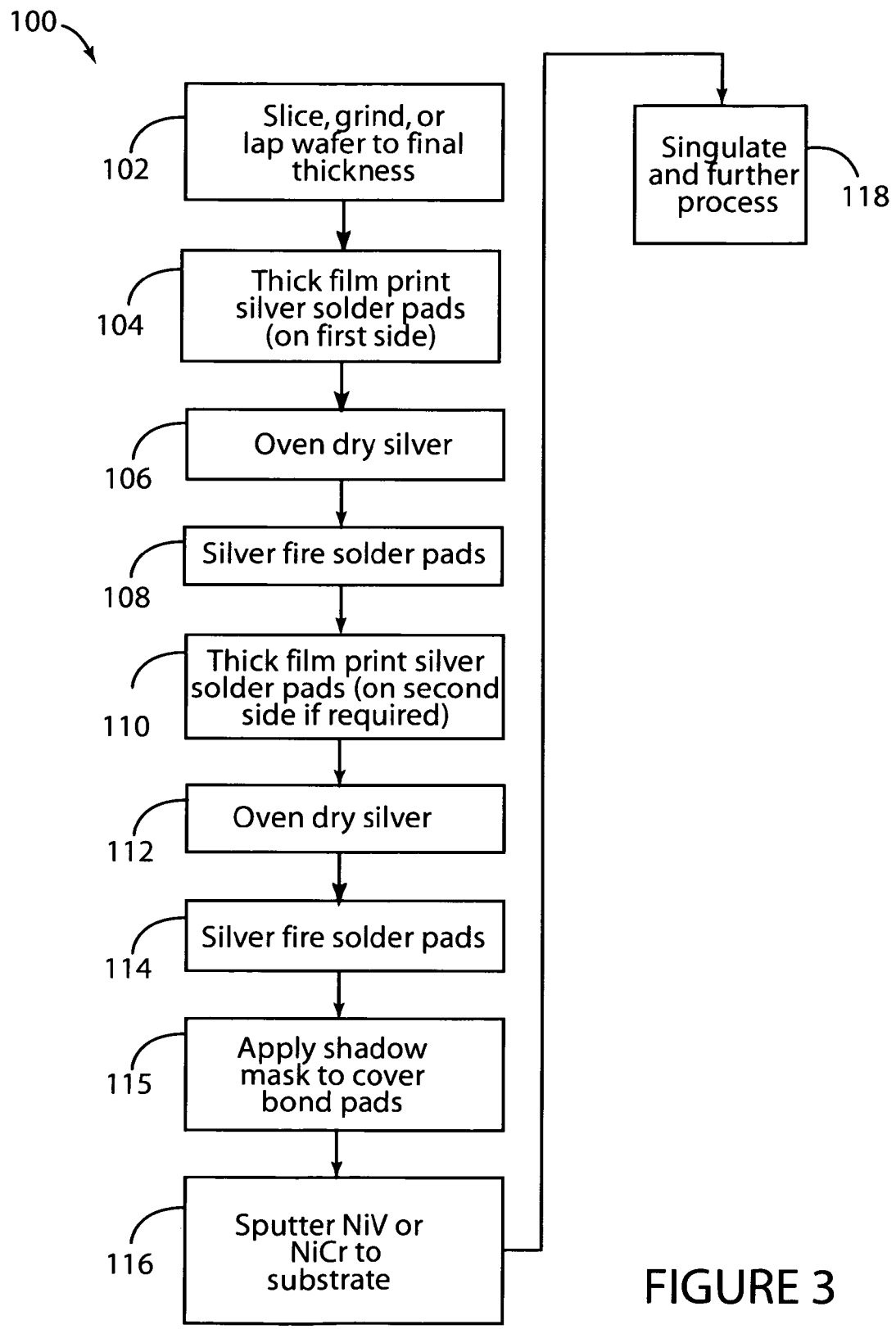
FIG. 3 is a flowchart of a manufacturing process for the piezoelectric assembly of FIG. 1.

A flowchart of a manufacturing process 100 for piezoelectric assembly 10 is shown in FIG. 3 and includes the following process sequence:

1. An array of PZT substrates 12 are ground or polished to a final thickness at step 102.
2. At step 104, bond pad 60 is screen printed on top surface 13 of substrate 12 using a thick film silver paste material and a conventional screen printing process.
3. Bond pad 60 is dried at step 106.
4. At step 108, substrate 12 is placed into an oven and heated to approximately 900 degrees Centigrade causing bond pad 60 to sinter and bond to top surface 13.
5. At step 110, if bond pad 70 is used, bond pad 70 is screen printed on bottom surface 14 of substrate 12 using a thick film silver paste material and a conventional screen printing process.
6. Bond pad 70 is dried at step 112.
7. At step 114, substrate 12 is placed into an oven and heated to approximately 900 degrees Centigrade causing bond pad 70 to sinter and bond to bottom surface 14.
8. A shadow mask is placed over top surface 13, bottom surface 14 and side surfaces 20 and 22 of substrate 12 to cover bond pads 60 and 70 at step 115.
9. At step 116, substrate 12 is placed into a sputtering chamber and either NiV or NiCr is sputter deposited onto the exposed portions of surfaces 13 and 14 to form electrodes 40 and 50.
10. At step 118, substrate 12 may be cut into individual pieces or singulated, if substrate 12 was processed as an array.

Alternative Embodiment

Figure 4:
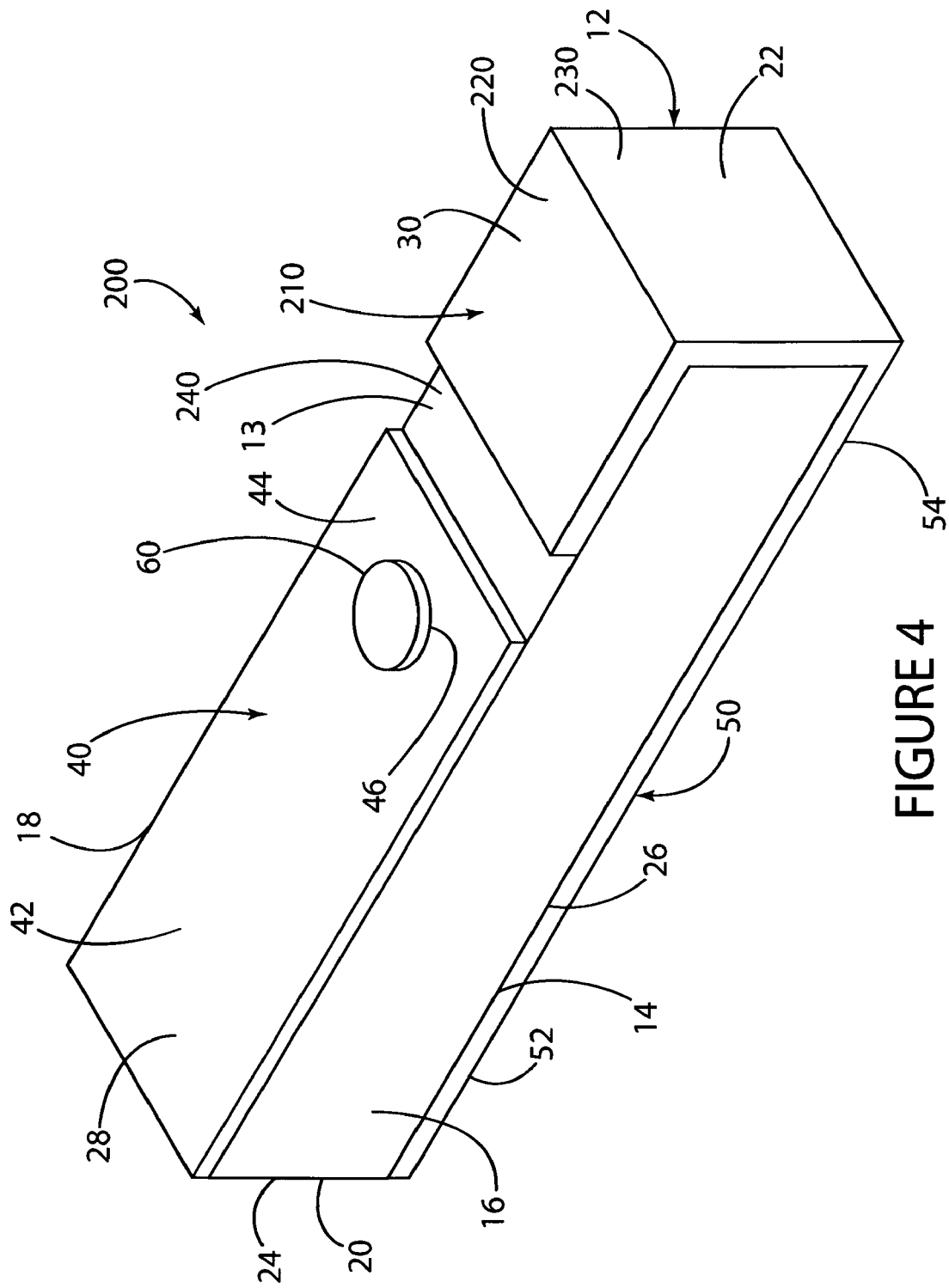
FIG. 4 is a perspective view of another embodiment of a piezoelectric assembly in accordance with the present invention.
Figure 5:
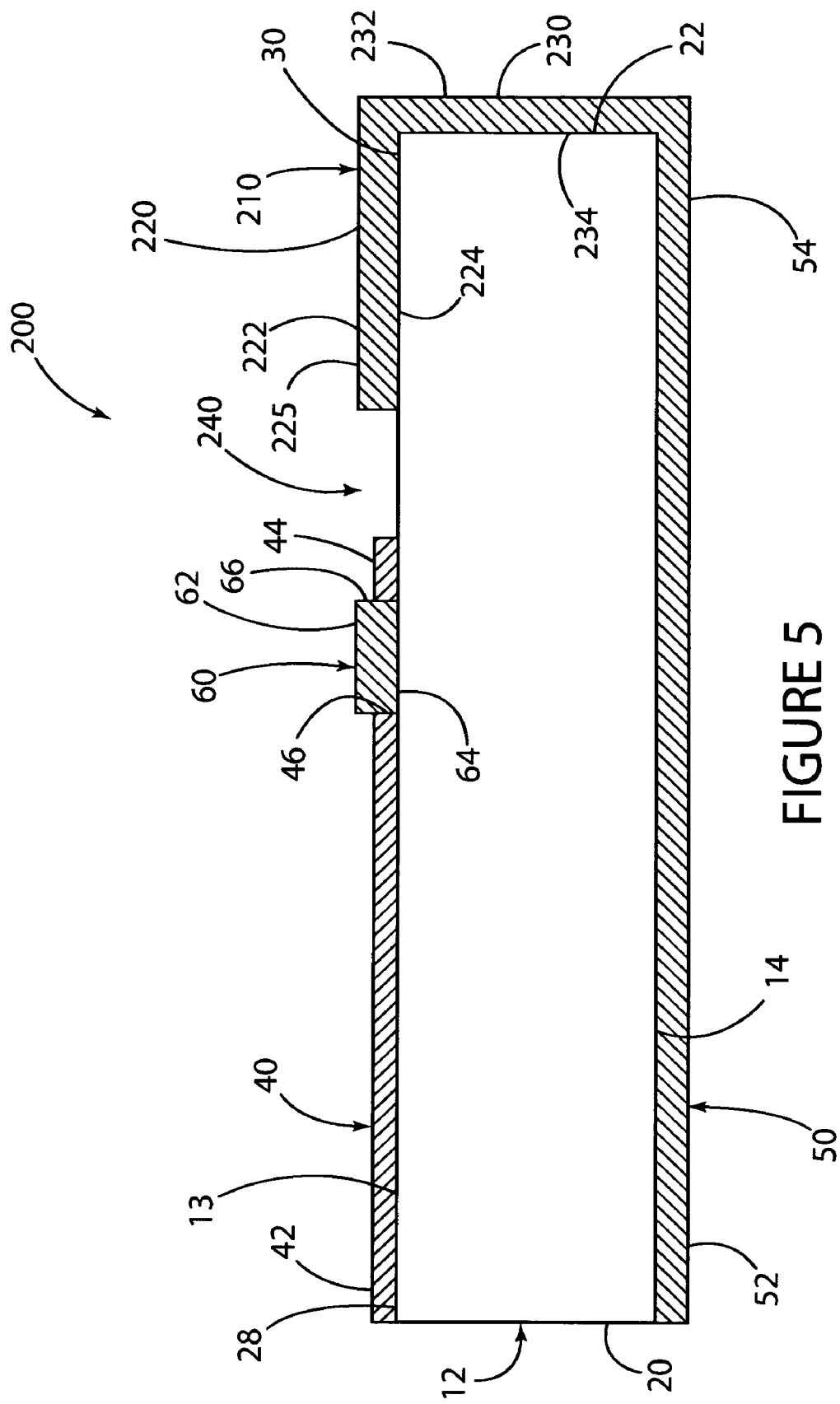
FIG. 5 is a vertical cross-sectional view of the piezoelectric assembly shown in FIG. 4.

Another embodiment of a piezoelectric assembly 200 in accordance with the present invention is shown in FIGS. 4 and 5. Piezoelectric assembly 200 includes a generally rectangularly-shaped piezoelectric substrate 12 that has a top surface 13, a bottom surface 14, and four side surfaces or faces 16, 18, 20 and 22. Substrate 12 defines edges 24 (FIG. 4) at the intersection between the side surfaces and edges 26 (FIG. 4) defined at the intersection between the top and side surfaces. Substrate 12 defines opposed longitudinal ends 28 and 30. Substrate 12 may also have other shapes such as round or square.

Piezoelectric substrate 12 may be made out of a wide variety of piezoelectric ceramic materials such as lead zirconate titantate (Pb(ZrTi)O$_3$), commonly known by the abbreviation PZT. Piezoelectric substrate 12 may also be formed out of other materials such as quartz or lithium niobate. Piezoelectric substrate 12 exhibits the piezoelectric effect wherein the overall shape of the substrate changes when an electrical potential is applied.

Piezoelectric assembly 200 may have overall dimensions of about 0.400 inches in length by about 0.100 inches in width by about 0.025 inches in height.

A thin film top electrode 40 is located on and overlays a portion of top surface 13 and a thin film bottom electrode 50 is located on and overlays bottom surface 14. Thin film electrodes 40 and 50 can be formed from a metal composition that is not solderable such as nickel and vanadium or can be formed from a composition of nickel and chromium. The compositions can be deposited using a conventional sputtering process. Top electrode 40 defines opposed end portions 42 and 44 and a circular aperture 46 formed adjacent end portion 44 thereof. In the embodiment of FIGS. 4 and 5, electrode 40 extends over a length of top surface 13 which is less than the full length of the top surface 13, i.e., electrode end portion 44 is spaced from and terminates at a point on top surface 13 which is short of the side surface 22. Electrode 50 extends the full length and width of bottom surface 14. Bottom electrode 50 defines opposed end portions 52 and 54.

A generally circular thick film top bond pad 60 is located in aperture 46 and is seated on the top surface 13 of substrate 12. Thick film bond pad 60 can be formed from a solderable metal composition such as silver and palladium or can be formed from a composition of silver or gold. Top bond pad 60 defines a top surface 62, a bottom surface 64, and an outer peripheral side surface 66.

Bond pad 60 has a thickness which allows the same to extend above the top surface and thickness of electrode 40.

A wrap around bond pad 210 is located on and overlies the end portion 30 of top surface 13 and the full length and width of adjacent side surface 22. Wrap around bond pad 210 can be formed from a solderable metal composition such as silver and palladium or can be formed from a composition of silver or gold. Wrap around electrode 210 thus defines a top portion 220 disposed on top surface 13 and a side portion disposed on side surface 22 and terminating unitarily into and with the terminal end portion 54 of electrode 50 on bottom surface 14. Top portion 220 defines an upper surface 222 and a lower surface 224 in abutting contact with top surface 13. Side portion 230 defines an outer surface 232 and an inner surface 234 in contact with side surface 22.

Electrode 40 is spaced from pad 210 and, more specifically, the top portion 220 thereof to define an electrical isolation area or gap or space 240 defined in the region of the top surface 13 located between the distal end 44 of electrode 40 and the proximal end 225 (FIG. 5) of pad 210. Electrical isolation area 240 electrically isolates electrode 40 from wrap around bond pad 210.

Wrap around pad 210 has a thickness greater than the thickness of electrode 40. Electrode 40 has a typical thickness of about 750 Angstroms. Bond pad 60 has a typical thickness of about 350 μinches and a typical diameter or width of about 0.070 inches. The maximum diameter of bond pad 60 may be less than about fifty percent of the surface area of electrode 40.

Electrode 50 has a typical thickness of about 750 Angstroms. Wrap around bond pad 210 has a typical thickness of about 350 μinches.

The thick film compositions can be deposited using a conventional thick film screening and firing process.

Electrode 40 is connected to bond pad 60 along outer peripheral surface 66 to form a mechanical and electrical bond during manufacturing processing. As described above, electrode 50 is connected to wrap around bond pad 210 along side portion 230 thereof to form a mechanical and electrical bond during manufacturing processing.

Bond pads 60 and 210 allow for piezoelectric assembly 200 to be connected to another external electrical circuit such as a printed circuit board. Bond pads 60 and 210 can be attached to a printed circuit board through the use of a reflowed solder paste or a conductive adhesive.

Because bond pads 60 and 210 are formed using a thick film material and process, bond pads 60 and 210 have a high bond strength to substrate 12.

Although the substrate 12 is shown in the form of a rectangular wafer with a plurality of side faces and the bond pads are shown as circles, it is understood that the substrate and bond pads can be formed in any suitable shape. For example, the substrate could be circular and the bond pads could be square.

Manufacturing Process

Figure 6:
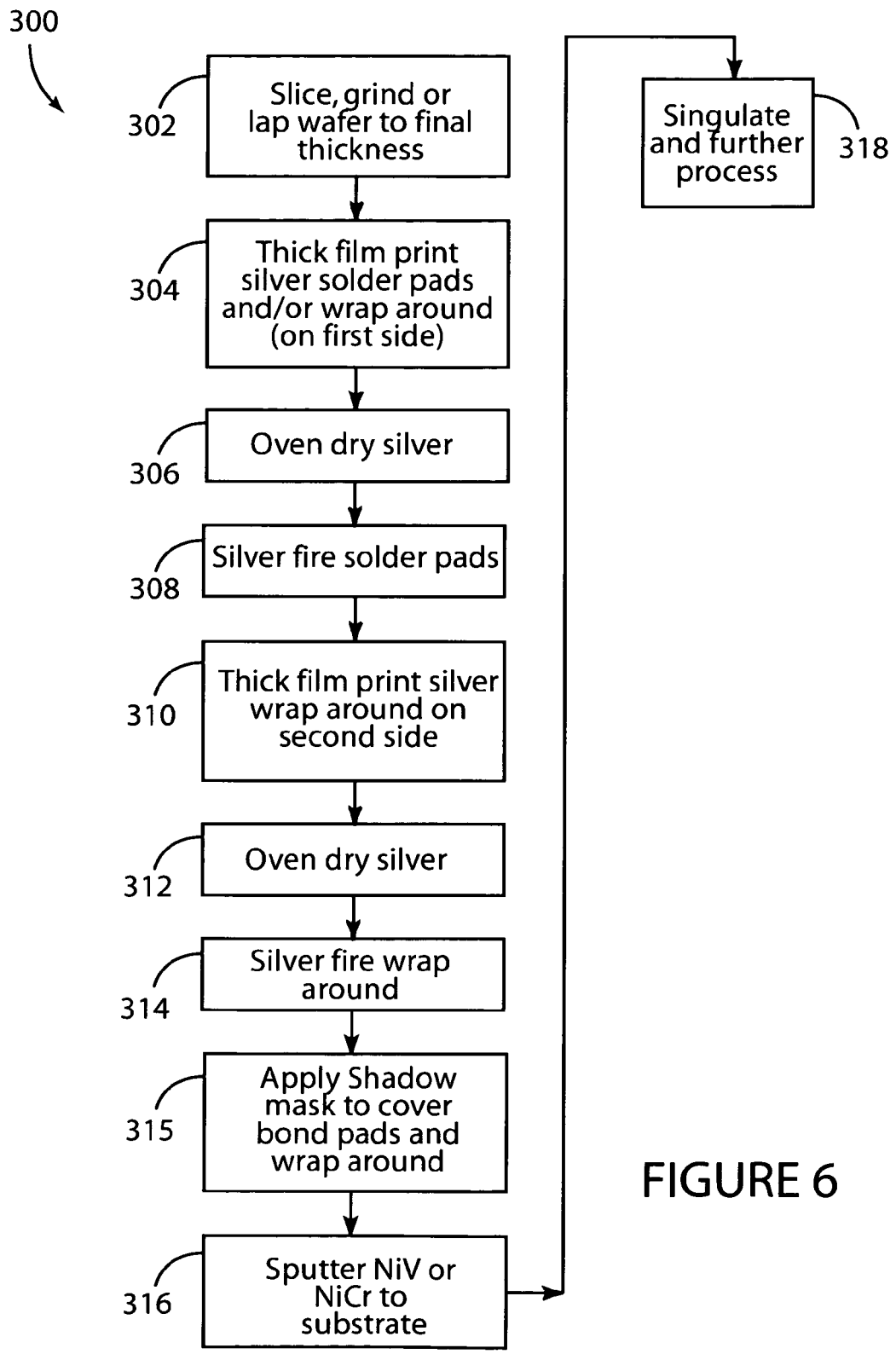
FIG. 6 is a flowchart of a manufacturing process for the piezoelectric assembly of FIG. 4.

A flowchart of a manufacturing process 300 for piezoelectric assembly 200 is shown in FIG. 6 and includes the following process sequence:

1. An array of PZT substrates 12 are ground or polished to a final thickness at step 302.
2. At step 304, bond pad 60 and top portion 220 of bond pad 210 are screen printed on top surface 13 of substrate 12 using a thick film silver paste material and a conventional screen printing process.
3. Bond pad 60 and top portion 220 of bond pad 210 are dried at step 306.
4. At step 308, substrate 12 is placed into an oven and heated to approximately 900 degrees Centigrade causing bond pad 60 and top portion 220 of bond pad 210 to sinter and bond to top surface 13.
5. At step 310, side portion 230 of bond pad 210 is screen printed on side surface 22 of substrate 12 using a thick film silver paste material and a conventional screen printing process.
6. Side portion 230 of bond pad 210 is dried at step 312.
7. At step 314, substrate 12 is placed into an oven and heated to approximately 900 degrees Centigrade causing side portion 230 of bond pad 210 to sinter and bond to bottom surface 14.
8. A shadow mask is placed over top surface 13, bottom surface 14 and side surfaces 20 and 22 of substrate 12 to cover bond pad 60 and portions 220 and 230 of bond pad 210 at step 315.
9. At step 316, substrate 12 is placed into a sputtering chamber and either NiV or NiCr is sputter deposited onto the exposed portions of surfaces 13 and 14 of substrate 12 to form electrodes 40 and 50.
10. At step 318, substrate 12 may be cut into individual pieces or singulated, if substrate 12 was processed as an array.

Conclusion

While the invention has been taught with specific reference to these two embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A piezoelectric assembly comprising:
   a piezoelectric substrate having at least a top surface and a bottom surface;
   a top electrode defined on the top surface;
   a first aperture defined in the top electrode;
   a bottom electrode defined on the bottom surface; and
   a first thick film bond pad disposed in the first aperture, the first thick film bond pad being in electrical contact with the top electrode.

2. The piezoelectric assembly according to claim 1, wherein a second aperture is defined in the bottom electrode.

3. The piezoelectric assembly according to claim 2, wherein a second thick film bond pad is disposed in the second aperture, the second thick film bond pad being in electrical contact with the bottom electrode.

4. The piezoelectric assembly according to claim 1, wherein the top and bottom electrodes are formed from a thin film material.

5. The piezoelectric assembly according to claim 1, wherein the thick film bond pad is formed by screen printing.

6. The piezoelectric assembly according to claim 1, wherein the thick film bond pad comprises a silver composition.

7. The piezoelectric assembly according to claim 1, wherein a second thick film bond pad is disposed on the top surface.

8. The piezoelectric assembly according to claim 7, wherein the top electrode extends less than the full length of the top surface and the second thick film bond pad is disposed on the region of the top surface not covered by the top electrode.

9. The piezoelectric assembly according to claim 8, wherein the second thick film bond pad wraps around the top surface and one of the side surfaces of the piezoelectric substrate.

10. A piezoelectric assembly comprising:
    a piezoelectric substrate having a top surface, a bottom surface and at least one side surface;
    a top electrode defined on a portion of the top surface;
    a first aperture defined in the top electrode;
    a bottom electrode defined on the bottom surface;
    a first thick film bond pad disposed in the first aperture, the first thick film bond pad being in electrical contact with the top electrode; and
    a second thick film bond pad disposed on the top surface and extending onto the side surface, the second thick film bond pad being in electrical contact with the bottom electrode.

11. The piezoelectric assembly according to claim 10, wherein the first and second thick film bond pads are located on the top surface and are spaced from each other.

12. The piezoelectric assembly according to claim 10, wherein the second thick film bond is disposed over an end portion of the top surface of the piezoelectric substrate.

13. The piezoelectric assembly according to claim 10, wherein the top and bottom electrodes are formed from a thin film material.

14. The piezoelectric assembly according to claim 10, wherein the first and second thick film bond pads are formed by screen printing.

15. The piezoelectric assembly according to claim 10, wherein the second thick film bond pad comprises a silver composition.

16. A piezoelectric assembly comprising:
- a piezoelectric substrate having at least a top surface and a bottom surface;
- a top and a bottom electrode defined on the top and bottom surfaces of the piezoelectric substrate respectively;
- a first and a second aperture defined in the top and bottom electrodes respectively; and
- a first and a second thick film bond pad disposed in the first and second apertures respectively and being in electrical contact with the top and bottom electrodes respectively.

17. The piezoelectric assembly according to claim 16, wherein the first and second thick film bond pads are disposed in a diametrically opposed relationship.

18. The piezoelectric assembly according to claim 16 wherein the top and bottom electrodes are formed from a thin film material and have a thickness less than the thickness of the first and second thick film bond pads.

* * * * *